(12) United States Patent  
Chen

(10) Patent No.: US 11,651,961 B2
(45) Date of Patent: May 16, 2023

(54) PATTERNING PROCESS OF A SEMICONDUCTOR STRUCTURE WITH ENHANCED ADHESION

(71) Applicant: Taiwan Semiconductor Manufacturing Co., Ltd., Hsin-Chu (TW)

(72) Inventor: Chien-Chih Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 330 days.

(21) Appl. No.: 16/892,899

(22) Filed: Jun. 4, 2020

(65) Prior Publication Data

US 2021/0035798 A1    Feb. 4, 2021

Related U.S. Application Data

(60) Provisional application No. 62/882,157, filed on Aug. 2, 2019.

(51) Int. Cl.
*H01L 21/027* (2006.01)
*G03F 7/09* (2006.01)
(Continued)

(52) U.S. Cl.
CPC ........ *H01L 21/0276* (2013.01); *G03F 7/0042* (2013.01); *G03F 7/0045* (2013.01);
(Continued)

(58) Field of Classification Search
CPC ............. H01L 21/0276; H01L 21/0332; H01L 21/0271; H01L 21/0337; H01L 21/31138;
(Continued)

(56) References Cited

U.S. PATENT DOCUMENTS 8,796,666 B1    8/2014 Huang et al.
9,093,530 B2    7/2015 Huang et al.
(Continued)

FOREIGN PATENT DOCUMENTS

KR    20150065584 A    1/1985
TW    2017-34025 A    10/2017
(Continued)

*Primary Examiner* — Caleen O Sullivan
(74) *Attorney, Agent, or Firm* — Haynes and Boone, LLP

(57) ABSTRACT

A lithography method includes forming a bottom anti-reflective coating (BARC) layer on a substrate, wherein the BARC layer includes an organic polymer and a reactive chemical group having at least one of chelating ligands and capping monomers, wherein the reactive chemical group is bonded to the organic polymer; coating a metal-containing photoresist (MePR) layer on the BARC layer, wherein the MePR being sensitive to an extreme ultraviolet (EUV) radiation; performing a first baking process to the MePR layer and the BARC layer, thereby reacting a metal chemical structure of the MePR layer and the reactive chemical structure of the BARC layer and forming an interface layer between the MePR layer and the BARC layer; performing an exposure process using the EUV radiation to the MePR layer; and developing the MePR layer to form a patterned photoresist layer.

20 Claims, 17 Drawing Sheets

(51) Int. Cl.
*G03F 7/16* (2006.01)
*G03F 7/004* (2006.01)
*G03F 7/20* (2006.01)
*G03F 7/32* (2006.01)
*G03F 7/11* (2006.01)

(52) U.S. Cl.
CPC ............... *G03F 7/091* (2013.01); *G03F 7/11* (2013.01); *G03F 7/162* (2013.01); *G03F 7/168* (2013.01); *G03F 7/2004* (2013.01); *G03F 7/322* (2013.01)

(58) Field of Classification Search
CPC ............. H01L 21/31144; G03F 7/0042; G03F 7/0045; G03F 7/091; G03F 7/11; G03F 7/162; G03F 7/168; G03F 7/2004; G03F 7/322; G03F 7/16; G03F 7/003; G03F 7/0043
USPC ........................................... 438/703; 430/330
See application file for complete search history.

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 2009/0053899 A1 | 2/2009 | Liu et al. |
| 2015/0192851 A1 | 7/2015 | Yamashita et al. |
| 2016/0233083 A1 | 8/2016 | Kim et al. |
| 2017/0092495 A1* | 3/2017 | Chen ................... H01L 21/0271 |
| 2017/0271150 A1 | 9/2017 | Chang et al. |
| 2020/0013620 A1* | 1/2020 | Fung ................... H01L 21/0332 |
| 2020/0159121 A1* | 5/2020 | Serizawa ................ C09D 7/63 |

FOREIGN PATENT DOCUMENTS

| | | |
|---|---|---|
| TW | 202004371 A | 1/2020 |
| WO | 2016172737 A1 | 10/2016 |
| WO | WO-2019-021975 A1 | 1/2019 |

* cited by examiner

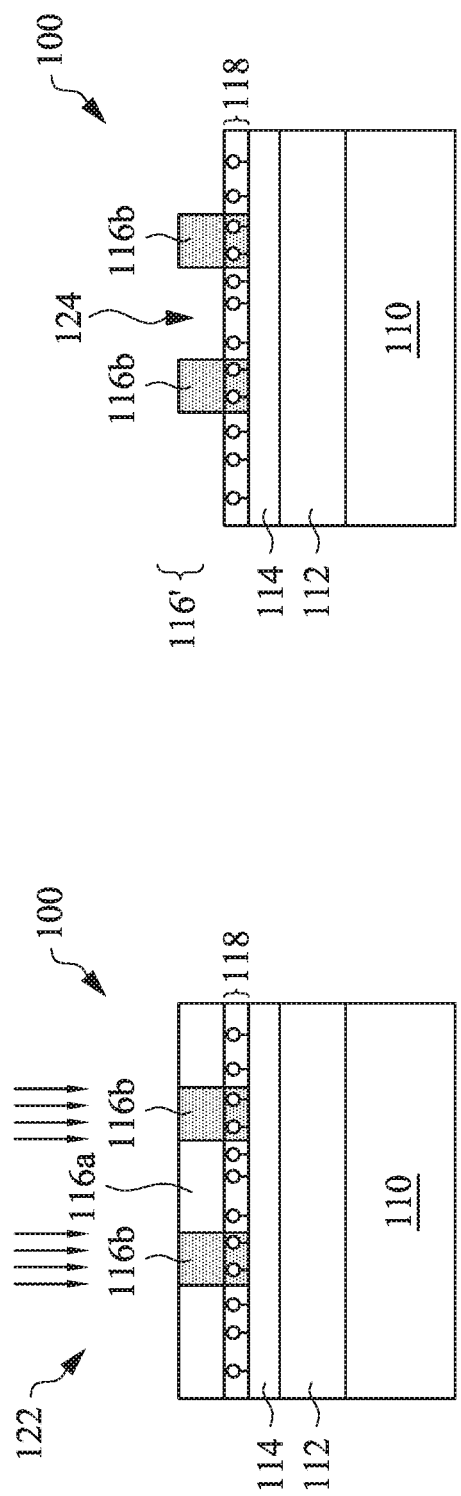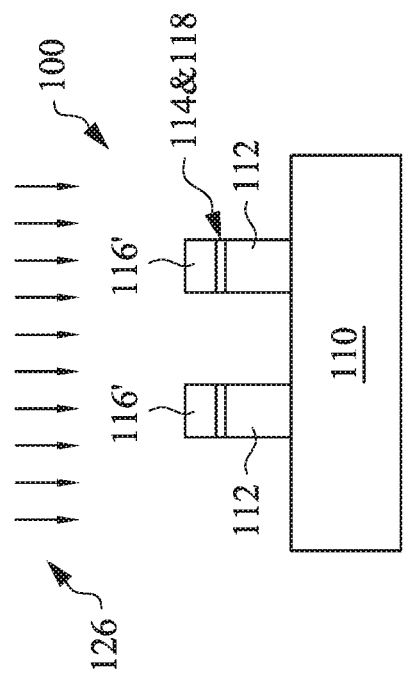

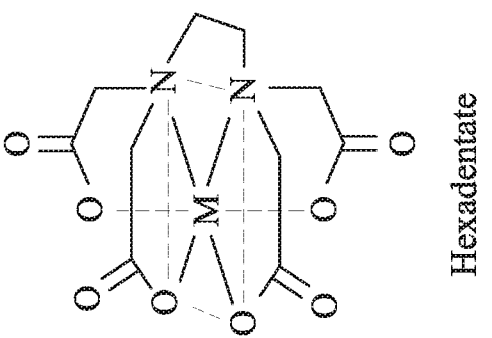
Hexadentate
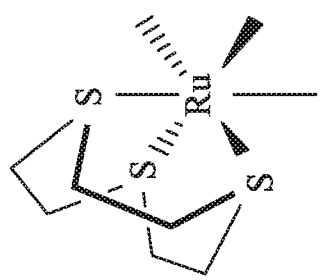
Tridentate
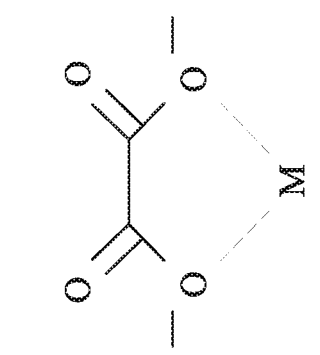
Bidentate
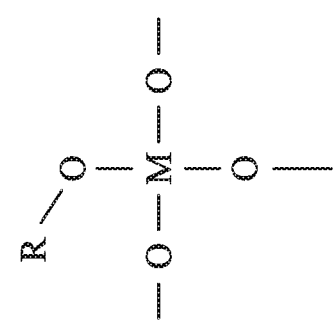
Monodentate
Fig. 11

PATTERNING PROCESS OF A SEMICONDUCTOR STRUCTURE WITH ENHANCED ADHESION

This application claims priority to U.S. Provisional Patent Application Ser. No. 62/882,157 filed Aug. 2, 2019, the entire disclosure of which is hereby incorporated herein by reference.

BACKGROUND

In integrated circuit (IC) fabrications, a patterned photoresist layer is used to transfer a designed circuit pattern having small feature sizes from a photomask to a wafer. The photoresist is light-sensitive and can be patterned by a photolithography process. Furthermore, the photoresist layer provides resistance to etch or ion implantation, which further requires a sufficient thickness. When IC technologies are continually progressing to smaller feature sizes, the thickness is not scaled down accordingly since the resistance requirement. Depth of focus sufficient enough to cover the thicker photoresist will degrade the imaging resolution. Multiple-film photoresist is introduced to overcome the above challenge. On other sides, this scaling down process generally provides benefits by increasing production efficiency and lowering associated costs. Such scaling down has also increased the complexity of processing and manufacturing ICs. For example, as the semiconductor fabrication continues to shrink pitches below 20 nm nodes, traditional i-ArF cannot meet resolution targets. Extreme ultraviolet (EUV) lithography has been utilized to support critical dimension (CD) requirements of smaller devices. EUV lithography employs scanners using radiation in the EUV region, having a wavelength of about 1 nm to about 100 nm. EUV lithography process has various challenges including strong absorptions by various materials, high fabrication cost, and photoresist sensitivity. Some EUV scanners provide 4× reduction projection printing onto a resist film coated on a substrate, similar to some optical scanners, except that the EUV scanners use reflective rather than refractive optics and optical module in the vacuum environment. The existing EUV lithography system, photoresist and method made various improvements but are not satisfactory. For example, the photoresist experiences scums and collapsing. Therefore, there is need for a EUV lithography process and photoresist materials to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7 and 8 illustrate sectional views of one exemplary semiconductor structure at various fabrication stages, constructed in accordance with some embodiments.

FIGS. 10, 11, 12 and 13 are diagrammatical views of various chemical structures in the BARC layer of FIG. 9, constructed according to aspects of the present disclosure in some embodiments.

DETAILED DESCRIPTION

Figure 1:
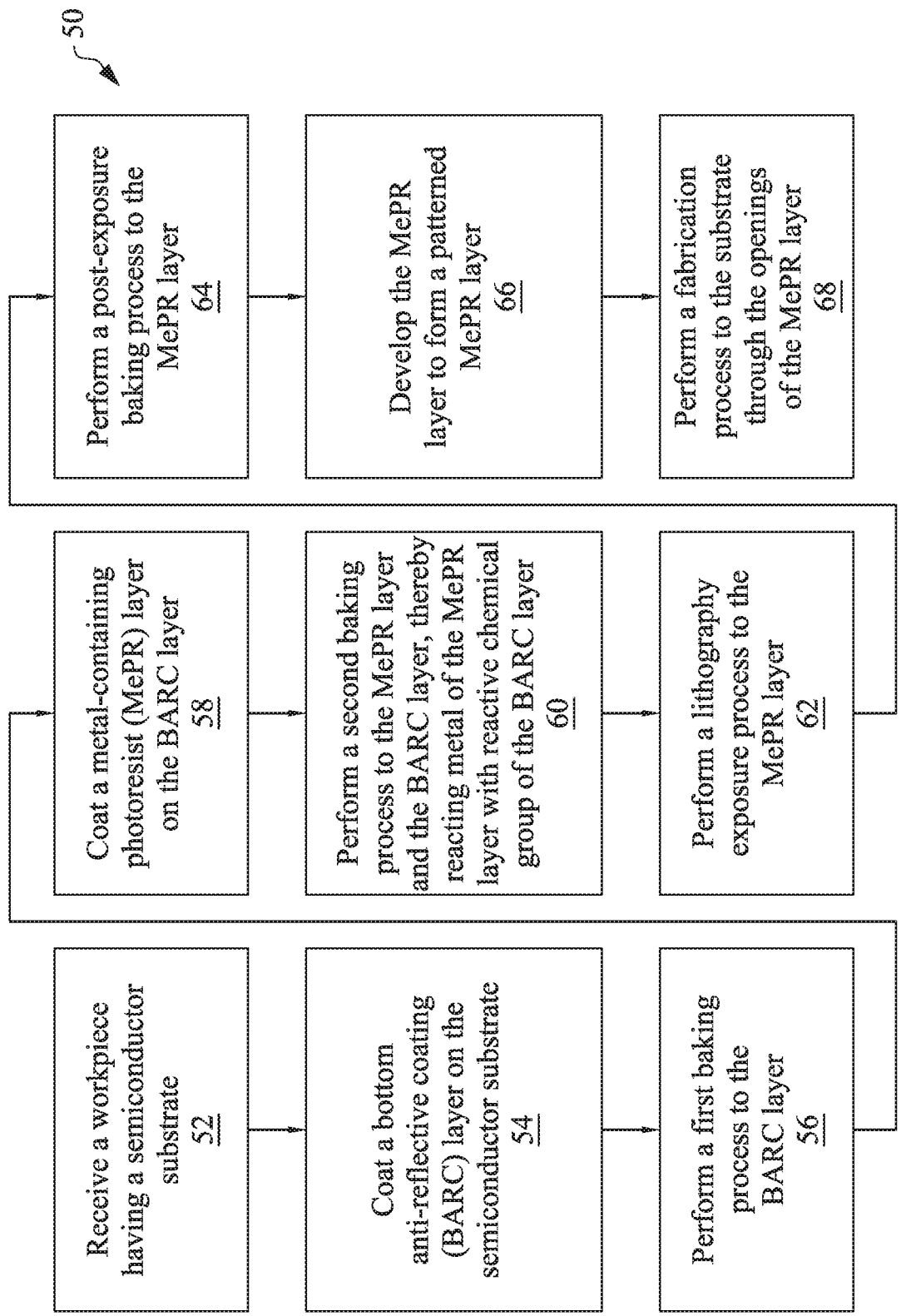
FIG. 1 is a flowchart of a method for a photolithography process constructed according aspects of the present disclosure in one embodiment.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to methods for semiconductor device fabrication, and more particularly to a lithography patterning process associated with extreme ultraviolet (EUV) radiation. In lithography patterning, after a photoresist (or simply resist) film is exposed to a radiation, such as a EUV radiation, it is developed in a developer (a chemical solution). The developer removes portions (such as unexposed portions as in a negative-tone photoresist) of the photoresist film, thereby forming a photoresist pattern which may include line patterns and/or trench patterns. The photoresist pattern is then used as an etch mask in subsequent etching processes, transferring the pattern to an underlying material layer. Alternatively, the photoresist pattern is then used as an ion implantation mask in subsequent ion implantation processes applied to the underlying material layer, such as an epitaxial semiconductor layer. In the present embodiment, the photoresist film and bottom anti-reflective coating (BARC) layer are designed with chemical compositions and process to form patterned photoresist with enhanced adhesion, reduced scum and improved lithography performance.

Patterned photoresist has various issues, such as photoresist collapsing, peeling and scum. The present disclosure addresses the above issues by a lithography method with composition and structure of the photoresist layer and BARC layer. Especially, the BARC layer includes organic polymer bonded with fluoro-containing PAGs, alternatively or additionally bonded with chelating ligands or capping monomers to enhance the photoresist adhesion.

FIG. 1 is a flowchart of a method 50 of patterning a substrate (e.g., a semiconductor wafer) according to various aspects of the present disclosure in some embodiments. The method 50 may be implemented, in whole or in part, by a system employing advanced lithography processes with radiation such as, extreme ultraviolet (EUV) light. Additional operations can be provided before, during, and after the method 50, and some operations described can be replaced, eliminated, or moved around for additional embodiments of the method.

FIGS. 2 through 8 are sectional views of a semiconductor structure (workpiece) 100 at various fabrication stages in accordance with some embodiments. The method 50 and the semiconductor structure 100 fabricated by the method are collectively described with reference to FIGS. 1-22. The semiconductor structure 100 may be an intermediate workpiece during the fabrication of an integrated circuit (IC), or a portion thereof. The IC may include logic circuits, memory structures, passive components (such as resistors, capacitors, and inductors), and active components such as diodes, field-effect transistors (FETs), metal-oxide semiconductor field effect transistors (MOSFET), complementary metal-oxide semiconductor (CMOS) transistors, bipolar transistors, high voltage transistors, high frequency transistors, fin-like FETs (FinFETs), other three-dimensional (3D) FETs, such as gate-all-around, (GAA) FETs, nanowire transistors, nanosheet transistors, and combinations thereof.

Figure 2:
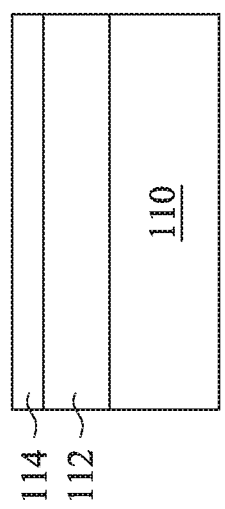

Referring now to FIG. 1 in conjunction with FIG. 2, the method 50 begins at block 52 with the semiconductor structure 100. The semiconductor structure 100 is a semiconductor wafer in the present embodiment. The semiconductor structure 100 includes a semiconductor substrate 110, such as a silicon substrate in some embodiments. The substrate 110 may include another elementary semiconductor, such as germanium, or diamond in some embodiments. The substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. The substrate 110 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 110 may include a semiconductor-on-insulator (SOI) structure. For examples, the substrate may include a buried oxide (BOX) layer formed by a process such as separation by implanted oxygen (SIMOX).

The semiconductor structure 100 may also include other material layers and other circuit patterns. For examples. The semiconductor structure 100 includes various doped features, such as doped well structure (e.g., a P-typed doped well and an N-type doped well) formed in the semiconductor substrate 110. In other embodiments, the semiconductor structure 100 may further include one or more material layers to be patterned (by etching to remove or ion implantation to introduce dopants), such as a dielectric layer to be patterned to form trenches for conductive lines or holes for contacts or vias; a gate material stack to be patterned to form gates; or a semiconductor material to be patterned to form isolation trenches. For example, a material layer to be patterned is a semiconductor layer as a part of the semiconductor substrate 110. In other embodiments, multiple semiconductor material layers, such as gallium arsenic (GaAs) and aluminum gallium arsenic (AlGaAs), are epitaxially grown on the semiconductor substrate and are patterned to form various devices, such as light-emitting diodes (LEDs). In some other embodiments, the semiconductor structure 100 includes fin active regions and three-dimensional fin field-effect transistors (FinFETs) formed or to be formed thereon. In other embodiments, the substrate 110 may further include epitaxially grown alternative semiconductor material layers, such as a stack of multiple silicon and silicon germanium to form field-effect transistors (FETs) with vertically stacked channels, such as gate-all-around FETs.

A bi-layer or a tri-layer photoresist may be formed on the semiconductor substrate 110. In some embodiments with a tri-layer photoresist, an under layer is formed on the semiconductor substrate 110, a BARC layer is formed on the under layer; and a photoresist layer is formed on the BARC layer. However, it was found that the patterned photoresist layer experiences collapsing or peeling issues due to high aspect ratio and poor adhesion. The disclosed BARC layer and the photoresist layer are designed and processed to provide a mechanism to form an interfacial layer therebetween to increase the adhesion strength and eliminate the collapsing issues.

Still referring now to FIG. 2, an under layer 112 may be formed on the semiconductor substrate 110 according to some embodiments. The under layer 112 is designed to provide resistance to etching or ion implantation. The under layer 112 functions as a mask to protects the substrate 110 from etching or ion implantation. Accordingly, the under layer 112 has a sufficient thickness to achieve this. In some embodiments, the under layer 112 includes an organic polymer free of silicon. In some embodiments, the formation of the under layer 112 includes spin-on coating and curing (such as a thermal baking process with a proper baking temperature). The under layer 112 may also function to planarize the top surface and reduce the surface roughness and height variation of the workpiece. Alternatively, the under layer 112 is a material layer to be patterned, such as a semiconductor material layer to be patterned to form fin active regions or vertically stacked channels; a dielectric material layer to be patterned to form trenches for isolation or metal traces; or a conductive material layer to be patterned to form gate electrodes or metal lines.

Referring to FIG. 1 in conjunction with FIG. 2, the method 50 includes an operation 54 by coating a bottom anti-reflective-coating (BARC) layer 114 on the semiconductor substrate 110 (or on the under layer 112 if present). The BARC layer 114 is designed to reduce the light reflection to enhance the imaging resolution and increase the imaging contrast of the lithography exposure process. In some embodiments, the BARC layer 114 is further designed to provide etch selectivity from the under layer 112 such that it functions as an etch mask to transfer a pattern to the under layer 112. The BARC layer 114 is coated by a suitable method, such as spin-on coating. In the present embodiment, the BARC layer 114 is a solution when it is coated on the workpiece and needs to be cured at a later stage. Such coated BARC layer 114 may be referred to as pre-cure BARC layer 114, which is a solution that includes a solvent mixed with various chemicals, to be described later.

Figure 3:
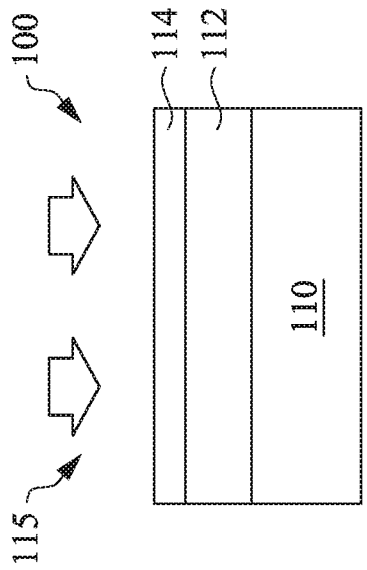

Referring now to FIG. 1 in conjunction with FIG. 3, the method 50 proceeds to an operation 56 by performing a first baking process 115 to the pre-cure BARC layer 114 for curing, thereby forming the cured BARC layer 114. The baking process include a baking temperature ranging between 160° C. and 250° C. The baking process 115 crosslinks the oligomer of the polymer to form huge polymer and further bond various chemicals.

Figure 9:
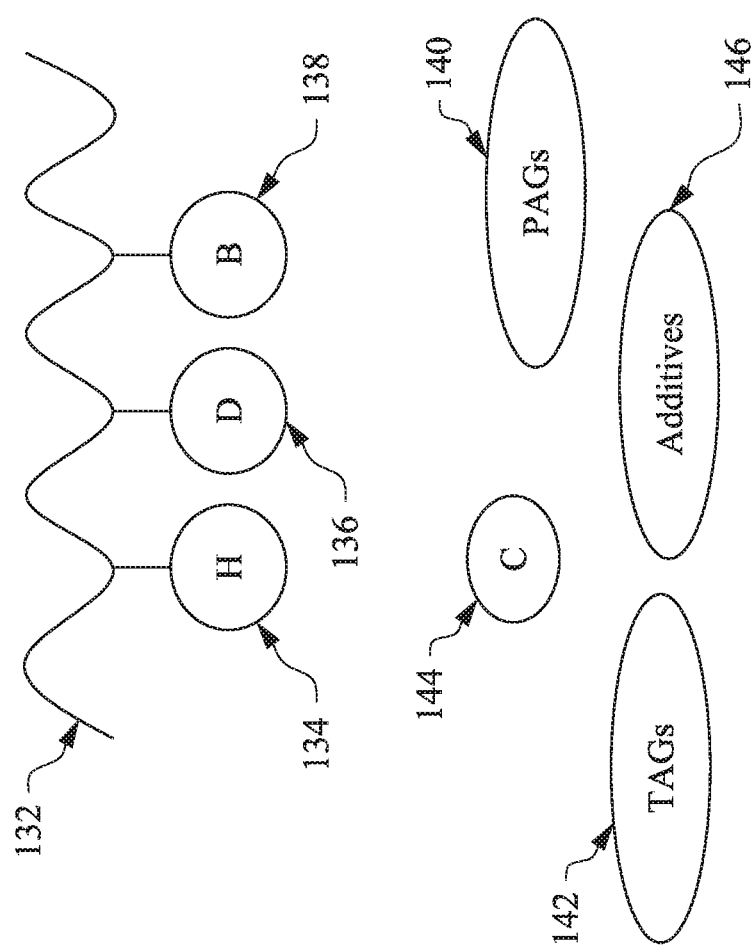
FIG. 9 is a diagrammatical view of a chemical structure of a bottom anti-reflective coating (BARC) layer used in a photolithography process, constructed according to aspects of the present disclosure in some embodiments.
Figure 10:
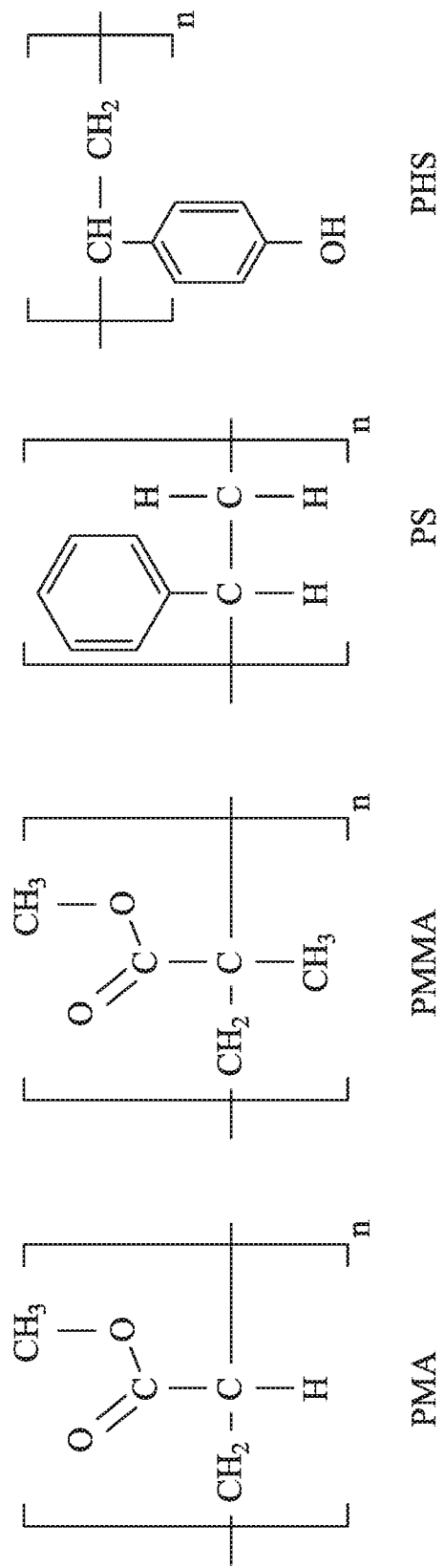

The BARC layer 114 includes a solvent, a polymer, and additives with its chemical structure schematically illustrated in FIG. 9 in accordance with some embodiments. Particularly, the BARC layer 114 includes capping monomers or chelating ligands bonded to backbones of the polymer material.

The composition of the BARC layer 114 is further described in detail according to various embodiments. The BARC layer 114 includes a suitable organic polymer 132 as backbone. The organic polymer 132 may include Polystyrene (PS), Poly-hydroxy-styrene (PHS) resin polymer, Poly (methyl methacrylate) (PMMA), or poly(methyl acrylate) (PMA), as illustrated respectively in FIG. 10, or other suitable organic polymers. The organic polymer 132 includes a plurality of monomers bonded into a long chain.

The BARC layer 114 further includes various chemical groups chemically bonded to the organic polymer 132. Especially, the BARC layer 114 includes a reactive chemical group 134 (labeled as "H") that is chemically bonded to the organic polymer 132. The reactive chemical group 134 can react with metal of the photoresist through chemical bonds, such as ionic bonds, covalent bonds, hydrogen bonds or a combination thereof. In some embodiments, the structure of the reactive chemical group 134 may have a non-cyclic structure or a cyclic structure, wherein the cyclic structure may be an aromatic, or a non-aromatic ring.

The reactive chemical group 134 may include a $C_2$-$C_{30}$ alkyl group. The reactive chemical group 134 may include at least one of diols, dithiols, diamines, diphosphines, diphosphites, esters, amides, imines, acetals, ketals, anhydrides, sulfonic esters, t-Butyl, tert-Butoxycarbonyl, iso-Norbornyl, 2-Methyl-2-adamantyl, 2-Ethyl-2-adamantyl, 3-THF, Lactone, 2-THF, and 2-THP group and may further include a functionalized group such as —I, —Br, —Cl, —NH$_2$, —COOH, —OH, —SH, —N$_3$, —S(=O)—, alkene, alkyne, imine, ether, vinyl ether, acetal, hemiacetal, ester, aldehyde, ketone, amide, sulfone, acetic acid, cyanide, allene, imine, alcohol, diol, amine, phosphine, phosphite, aniline, pyridine, pyrrole or a combination thereof.

In the present embodiments, the reactive chemical group 134 includes chelating ligands or capping monomers. A chelating ligand is an ion or molecule that can form several bonds to a single metal ion or a metal atom. Various examples of the chelating ligands include Monodentate, Bidentate, Tridentate, Hexadentate, or a combination thereof, as illustrated in FIG. 11. In the listed chelating ligands, "R" represents an organic chemical, such as CH$_3$, C$_2$H$_5$, C$_3$H$_7$, and etc.; "M" represents a metal; "O" represents oxygen; "N" represents nitrogen; "Ru" represents ruthenium; and "S" represents sulfur. The metal "M" includes tin (Sn), cobalt (Co), nickel (Ni), iron (Fe), ruthenium (Ru), rhodium (Rh), other transitional metal or a combination thereof. Other examples of the chelating ligands are 152, 154, 156 and 158 illustrated in FIG. 12, in which "Ph" represents phenyl; "P" represents phosphorous; and "H" represents hydrogen.

Figure 13:
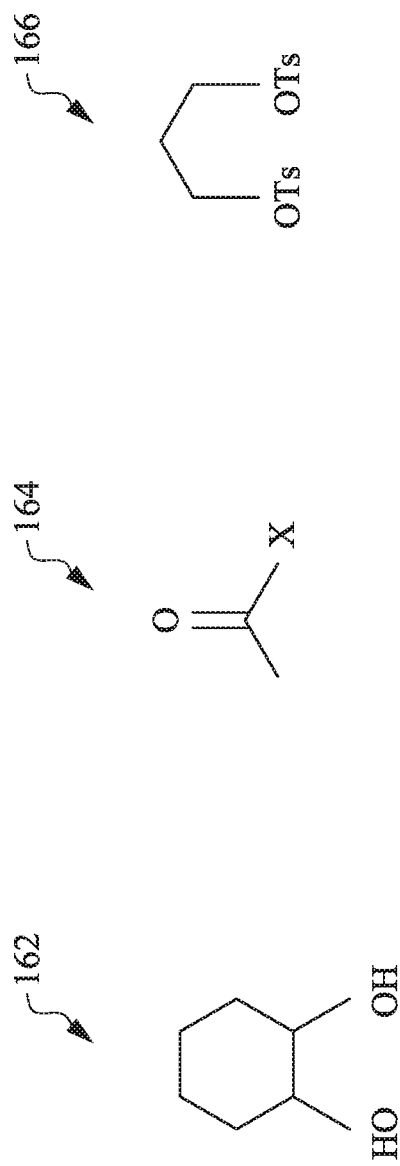

A capping monomer is a chemical structure having a function similar to that a chelating ligand. More particularly, the capping monomer can react with a metal ion or metal atom while its structure will change after the reaction, such as the capping monomer may lose a functional group after bonded to the metal ion or atom. Various examples of the capping monomers include 162, 164 and 166, as illustrated in FIG. 13, in which "Ts" represents tosyl; and "X" represents halogen, such as fluorine (F), chlorine (Cl), bromine (Br), iodine (I), or astatine (At).

Referring back to FIG. 9, the BARC layer 114 includes a polar group 136 (labeled as "D") that is chemically bonded to the organic polymer 132. The polar group 136 is added to enhancing the adhesion between the BARC layer 114 and the overlying photoresist layer to be formed. The polar group 136 can also reduce the scum and increase the developing effect the polar group can react with the metal complexes or metal ions via covalent bonding, ionic bonding, ion-dipole interactions, dipole-dipole interactions, ion-induced dipole interactions, dipole-induced dipole interactions and hydrogen bonding. The examples of the polar group 136 includes O—H, SH, amine, amide, ester and etc. In some embodiments, the polar group 136 includes an alkyl group for adhesion. The structure of the polar group may have a non-cyclic structure or a cyclic structure wherein the cyclic structure may be an aromatic or a non-aromatic ring. The polar group 136 may include a $C_1$-$C_{30}$ alkyl group for photoresist adhesion. The alkyl group may include a carbon group or a functionalized group such as —I, —Br, —Cl, —NH$_2$, —COOH, —OH, —SH, —N$_3$, —S(=O)—, alkene, alkyne, imine, ether, ester, aldehyde, ketone, amide, sulfone, acetic acid, cyanide, allene, alcohol, diol, amine, phosphine, phosphite, aniline, pyridine, pyrrole, or a combination thereof.

Still referring to FIG. 9, the BARC layer 114 may include an assisted organic group 138 (labeled as "B") that is chemically bonded to the organic polymer 132. The assisted organic group 138 is added to increase the adhesion and control the photoresist patterning. In various embodiments, the assisted organic group is the second polar group, or alternatively just the non-polar group for adhesion, depending on the interaction between the photoresist and the BARC layer. When the first polar group for adhesion is not enough, the second polar group different from the first polar group is added for interaction improvement. When the interaction of the first polar group is too strong to remove the unexposed photoresist, some non-polar groups are added to balance the interaction. Hence, the assisted organic group includes $C_1$-$C_{30}$ as the same as the polar group "D" and the assisted organic group can react with the metal complexes or metal ions via London dispersion forces, ion-dipole interactions, dipole-dipole interactions, ion-induced dipole interactions, dipole-induced dipole interactions and hydrogen bonding. The examples of the assisted organic group 138 includes an alkyl group for adhesion. The structure of the assisted organic group 138 may have be a non-cyclic structure or a cyclic structure wherein the cyclic structure may be an aromatic or a non-aromatic ring. The assisted organic group 138 may have a $C_1$-$C_{30}$ alkyl group for photoresist adhesion. The alkyl group may include a carbon group or a functionalized group such as —I, —Br, —Cl, —NH$_2$, —COOH, —OH, —SH, —N$_3$, —S(=O)—, alkene, alkyne, imine, ether, ester, aldehyde, ketone, amide, sulfone, acetic acid, cyanide, or a combination thereof.

In some embodiments, the BARC layer 114 further includes photoacid generators (PAGs) 140; thermal-acid generators (TAGs) 142; crosslinkers 144 (labeled as "C"); and other additives 146, distributed in the BARC layer 114 or alternatively chemically bonded to the organic polymer 132 of the BARC layer 114. The PAGs 140 are molecules that decompose and form a small amount of acid when absorbing photo energy. Note the PAGs are added to the BARC layer 114 instead of the photoresist in the present embodiment. The PAG cations can reduce the scum and reduce the footing issue, in which the bottom portion of the photoresist is not sufficiently exposed. An example of the PAGs 140 is triphenylsulfonium triflate with the formula [(C$_6$H$_5$)$_3$S$^+$][CF$_3$SO$^-_3$]. The TAGs 142 are molecules that generates acid at an elevated temperature or a thermal process with a higher temperature. An example of the TAGs 142 is Triflouromethane Sulfonic Acid. The crosslinkers 144 will further cross-link the photoresist for enhanced exposure effect when diffused into the photoresist from the BARC layer 114. Examples of the crosslinkers 144 include tetramethylol glycoluril, EDC (1-ethyl-3-(3-dimethylaminopropyl) carbodiimide hydrochloride), formaldehyde, glutaraldehyde, and other multifunctional cross-linking agents. In some embodiments, the additives 146 can be surfactants, and minor solvents. The crosslinkers can impact the cross-linking density of the BARC and have chemical effects to the BARC and photoresist intermixing. When the additives are surfactants and minor solvents, the additives can improve the BARC coating and the BARC crosslinking efficiency. Improved BARC coating and crosslinking efficiency are helpful to photoresist patterning.

Figure 14:
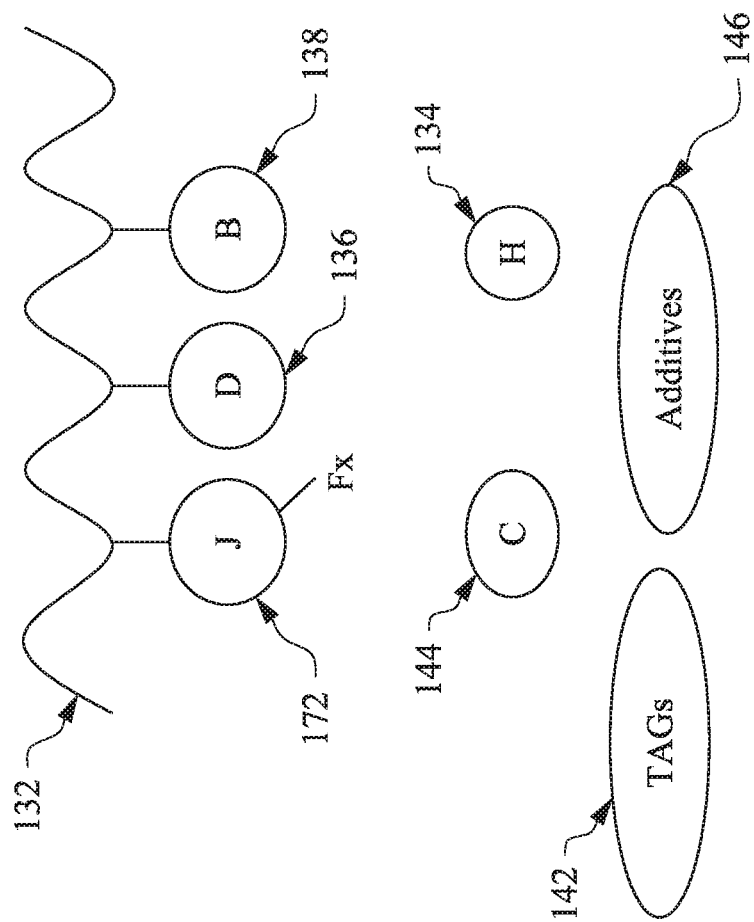
FIG. 14 is a diagrammatical view of a chemical structure of a BARC layer used in a photolithography process, constructed according to aspects of the present disclosure in some embodiments.

Alternatively, the BARC layer 114 may have other composition and structure schematically illustrated in FIG. 14 in accordance with some embodiments. The BARC layer 114 includes a polymeric material (polymer), solvent and additives. Particularly, the BARC layer 114 includes PAG bonded to backbones of the polymer material.

The BARC layer 114 in FIG. 14 is similar with the BARC layer 114 in FIG. 9 with some differences. Similar portions are not repeated here for simplicity. As illustrated in FIG. 14, the BARC layer 114 includes fluoro-containing PAGs 172 (labeled as "J-Fx") chemically bonded to the organic polymer 132. The fluoro-containing PAG 172 is a photoacid generator that contains fluorine (F) atoms.

Figure 15:
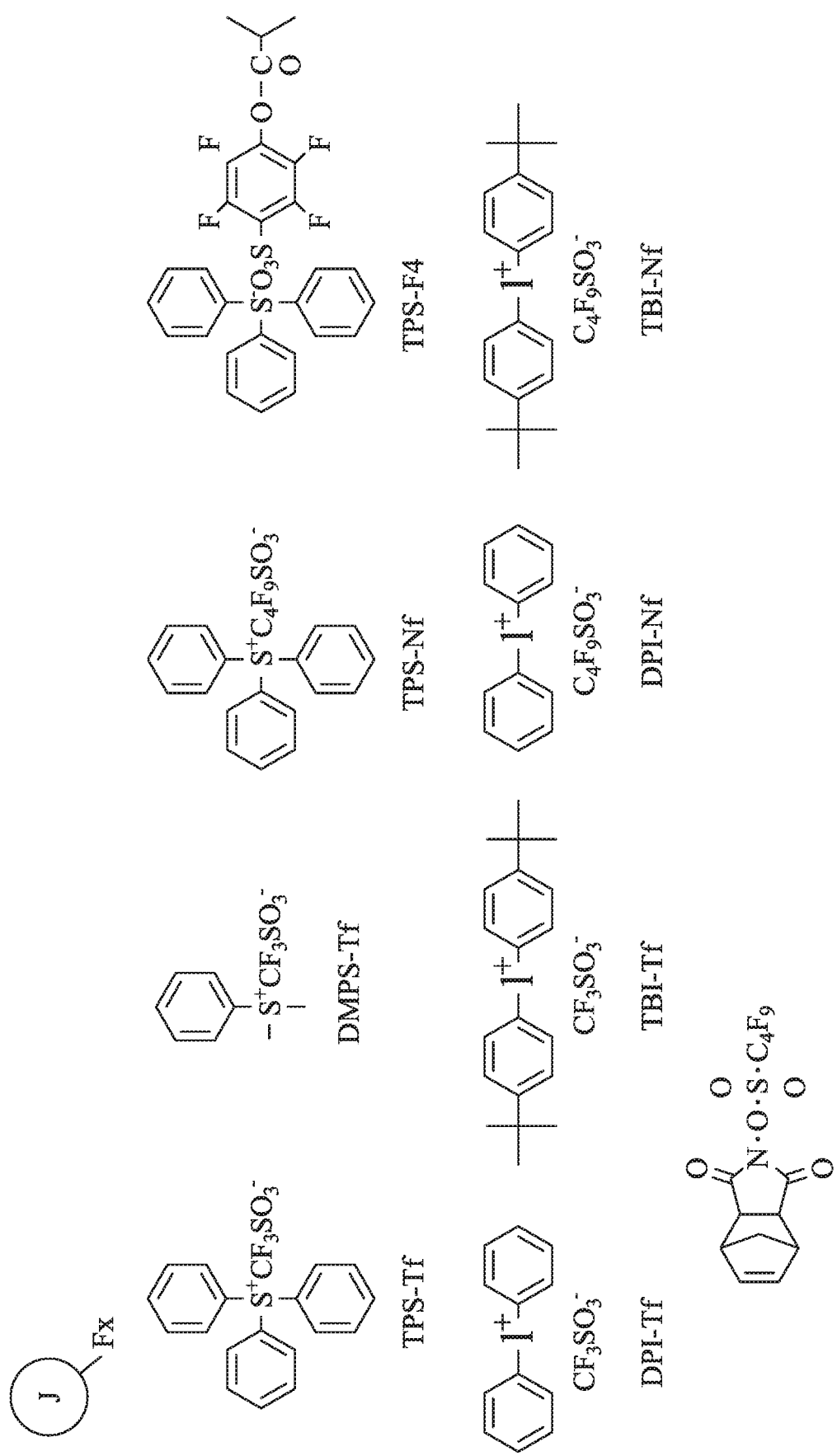
FIG. 15 is diagrammatical views of various chemical structures in the BARC layer of FIG. 14, constructed according to aspects of the present disclosure in some embodiments.

The fluoro-containing PAGs 172 is a light-sensitive chemical group and generates acids by light irradiation in the exposed area during a lithography exposure process. The fluoro-containing PAGs 172 may have a neutral group or a paired ionic group containing separate cation and anion. The fluoro-containing PAGs 172 includes a paired of ionic groups that may be an anion-bounded or a cation-bounded to the organic polymer 132. The fluoro-containing PAGs 172 may include a $C_3$-$C_{50}$ alkyl group containing fluorine atoms and at least one light-sensitive functional group, such as sulfonium salts, triphenylsulfonium triflate, triphenylsulfonium nonafalte, dimethylsulfonium triflate, indonium salts, diphenyliodonium nonaflate, norbornene dicarboximidyl nonaflate, epoxy, azo compounds, alkyl halide, imine, alkene, alkyne, peroxide, ketone, aldehyde, allene, aromatic groups or heterocyclic groups. The aromatic structures can be phenyl, napthlenyl, phenanthrenyl, anthracenyl, phenalenyl, and other aromatic derivatives containing three to ten-membered rings. Some examples of the fluoro-containing PAGs 172 are illustrated in FIG. 15

Figure 16:
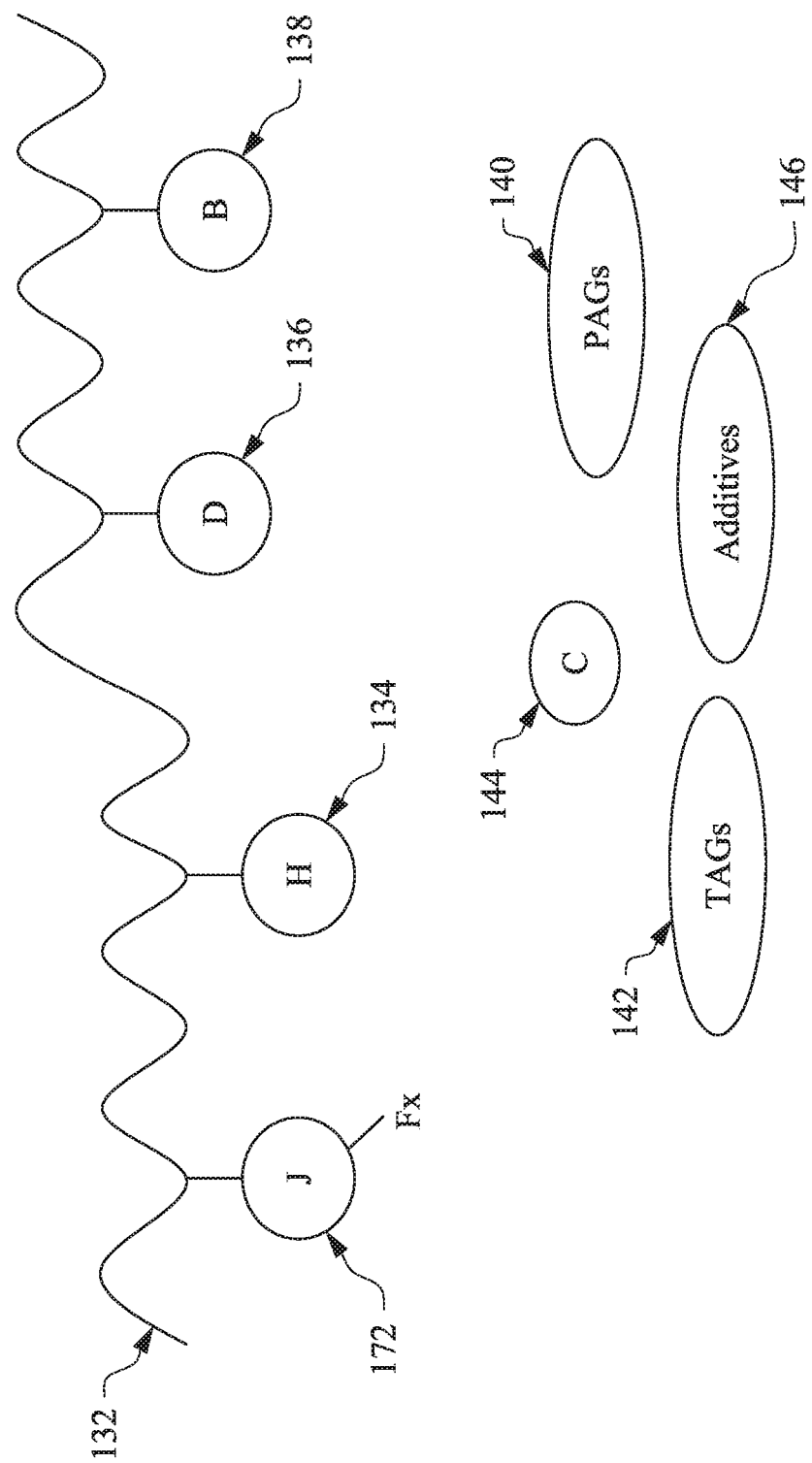
FIG. 16 is a diagrammatical view of a chemical structure of a BARC layer used in a photolithography process, constructed according to aspects of the present disclosure in some embodiments.
Figure 17:
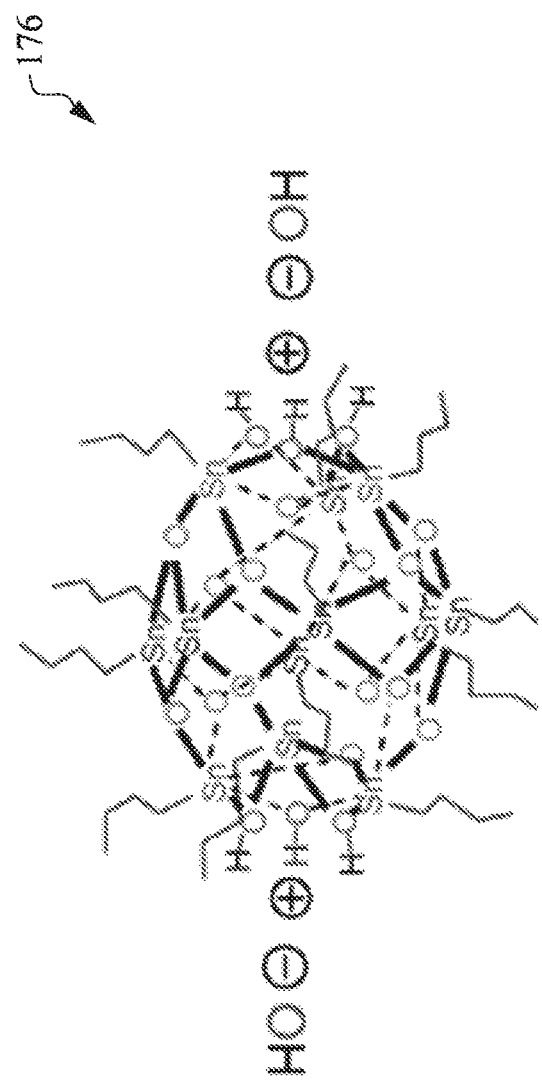
FIG. 17 is a diagrammatical view of a chemical structure in a metal-containing photoresist (MePR) layer used in a photolithography process, constructed according to aspects of the present disclosure in some embodiments.

In other embodiments, the BARC layer 114 may have a structure schematically illustrated in FIG. 16 in accordance with some embodiments. The BARC layer 114 includes a polymeric material (polymer), solvent and additives. Particularly, the BARC layer 114 includes the fluoro-containing PAGs 172 and the reactive chemical group 134 bonded to the organic polymer 132.

As noted above in FIG. 2, the BARC layer 114 coated on the workpiece 100 by the operation 54 is a solution before it is cured by the operation 56. More specifically, the pre-cure BARC layer 114 is a solution that includes a solvent; oligomer of the organic polymer 132 with various chemical groups, such as the reactive chemical group 134, the polar group 136, the PAGs 140, and etc.

The pre-cure BARC layer 114 in FIG. 3 is cured by the operation 54 by the baking process 115. The baking process 115 activates the crosslinkers 144 to crosslink the oligomer to form the organic polymer 132 with the reactive chemical group 134, and some other chemical groups (such as 136, 138 and etc.). Furthermore, the TAGs 142 generate acids during the baking process 115 and the generated acid enhances the crosslinking or polymerization process. The baking temperature is designed to effectively initiate the crosslinking to form the organic polymer 132 with the chemical groups (such as 134 and 172) to the organic polymer 132; and activate the TAGs 142. According to some embodiments, the baking process include a baking temperature ranging between 160° C. and 250° C.

Figure 4:
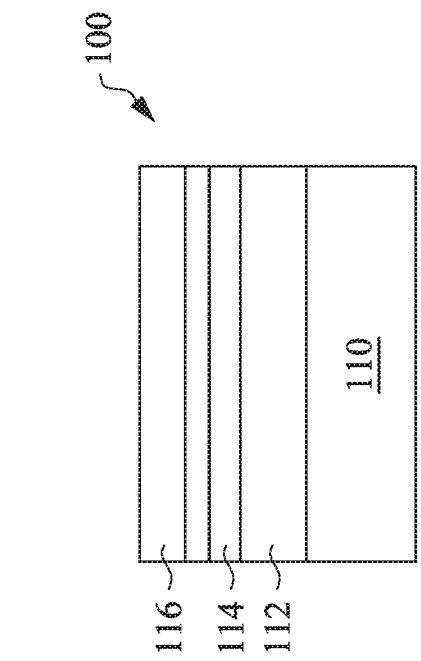

Referring now to FIG. 1 in conjunction with FIG. 4, the method 50 includes an operation 58 by coating a photoresist layer 116 on the BARC layer 114, such as by a spin-on coating process. The photoresist layer 116 is sensitive to the light radiation of the lithography exposure process to be applied at later stage. In the present embodiment, the photoresist layer 116 is sensitive to EUV radiation. The photoresist layer 116 includes metal to increase the sensitivity of the photoresist layer, therefore being also referred to as metal-containing photoresist (MePR) layer 116. The metal in the MePR layer 116 has a sufficient concentration for EUV sensitivity, such as being greater than 5% (weight percentage) of the MePR layer 116. In various examples, the MePR layer 116 includes one or more metal elements, such as tin (Sn), cobalt (Co), nickel (Ni), iron (Fe), ruthenium (Ru), rhodium (Rh) or a combination thereof. The metal of the MePR layer 116 is sensitive to EUV radiation. The structure of the MePR layer 116 may be in a proper form, such as metal-containing inorganic polymer; metal clusters; metal molecules; metal oxide chemical or a combination thereof. A metal molecule is a metal complex or metal compound. A metal oxide chemical is a chemical structure having metal oxide with outer organic ligand. A metal cluster is a chemical structure with multiple metal centers clustered together, such as a metal cluster 176 having multiple Sn illustrated in FIG. 17.

Figure 18:
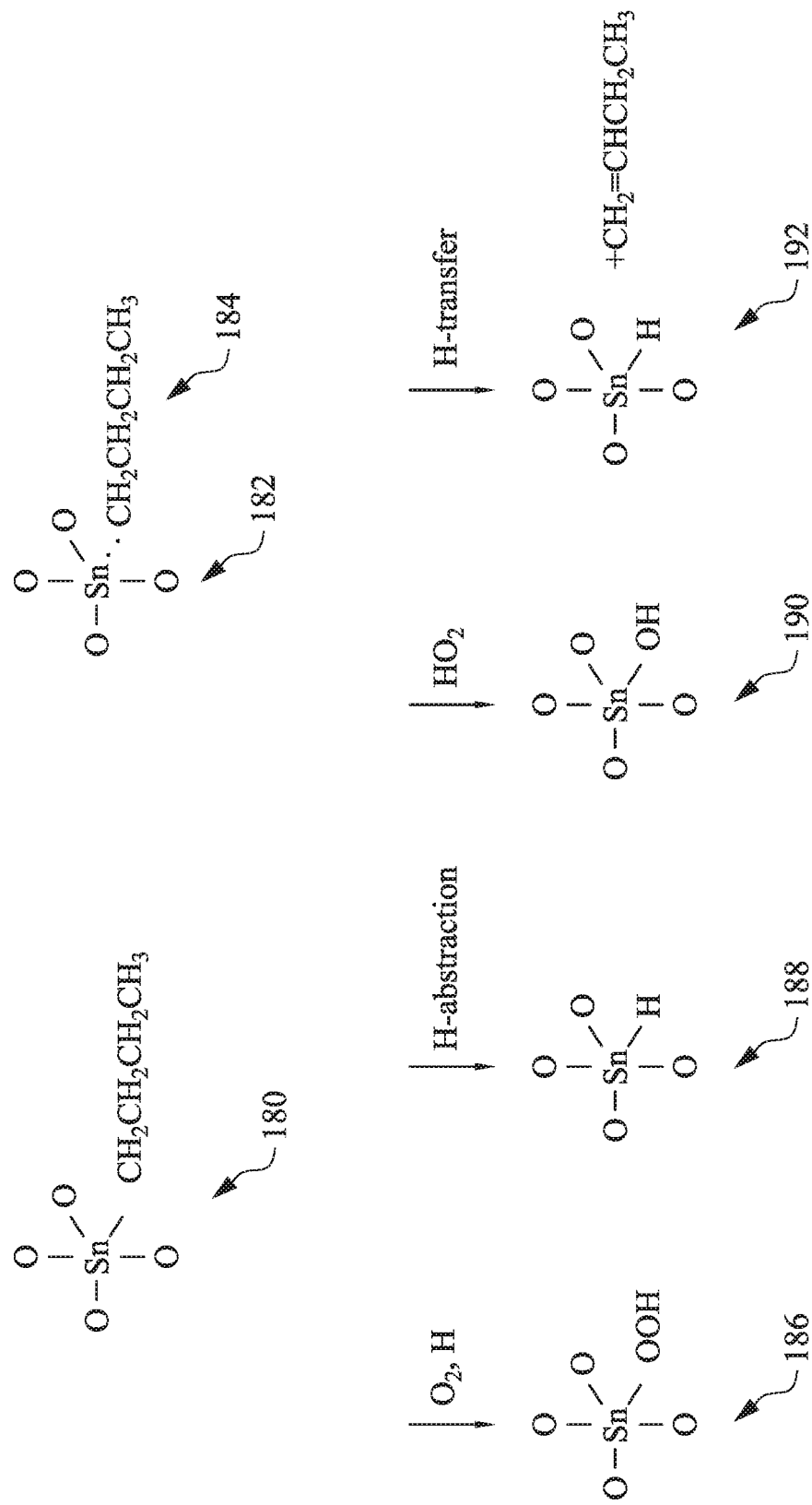
FIG. 18 is a diagrammatical view of a chemical structure and reaction of the MePR layer, constructed according to aspects of the present disclosure in some embodiments.

Referring to FIG. 18, the photochemical reaction of the MePR is further described using a Sn-containing molecule 180 as an example. Sn-containing molecule 180 includes a tin oxide $SnO_x$, in which "x" is an integer, such as 4. Upon EUV radiation, the Sn-containing molecule 180 absorbs EUV energy and has homolytic Sn—C bond cleavage, thereby dissociating into a tin oxide radical 182 and an n-butyl radical 184. The tin oxide radicals 182 further have $H/O_2/HO_2$ abstraction (reacts with H, $O_2$, $HO_2$, or a combination thereof), forming tin oxide complex, such as 186, 188, 190 or 192, as illustrated in FIG. 18. Those tin oxide complex further bond together to form an inorganic polymer through a polymerization, such as being initiated by a baking process. Thus, the exposed portions of the MePR layer 116 experience polymerization and survive in the developer while the unexposed portions are dissolved and removed in the developer. Therefore, the disclosed MePR is a negative-tone photoresist according to the present embodiment. Note that the MePR layer 116 is a solution when it is coated and may include solvent, metal-containing chemical (such as Sn-containing molecules) and other additives. In this example, the inorganic polymer is formed after the lithography exposure process.

Figure 5:
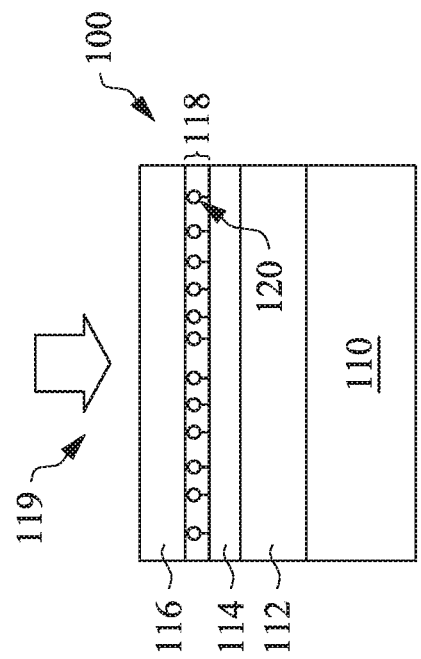

Referring now to FIG. 1 in conjunction with FIG. 5, the method 50 proceeds to an operation 60 by performing a second baking process 119 to the MePR layer 116, thereby reacting metal of the MePR layer 116 with reactive chemical groups 134 of the BARC layer 114 and forming an interface layer 118 between the BARC layer 114 and the MePR layer 116. The interface layer 118 and the bonding between the metal of the MePR layer 116 and the reactive chemical groups 134 of the BARC layer 114 increase the adhesion strength and eliminate or reduce the photoresist collapsing and peeling issues.

Figure 19:
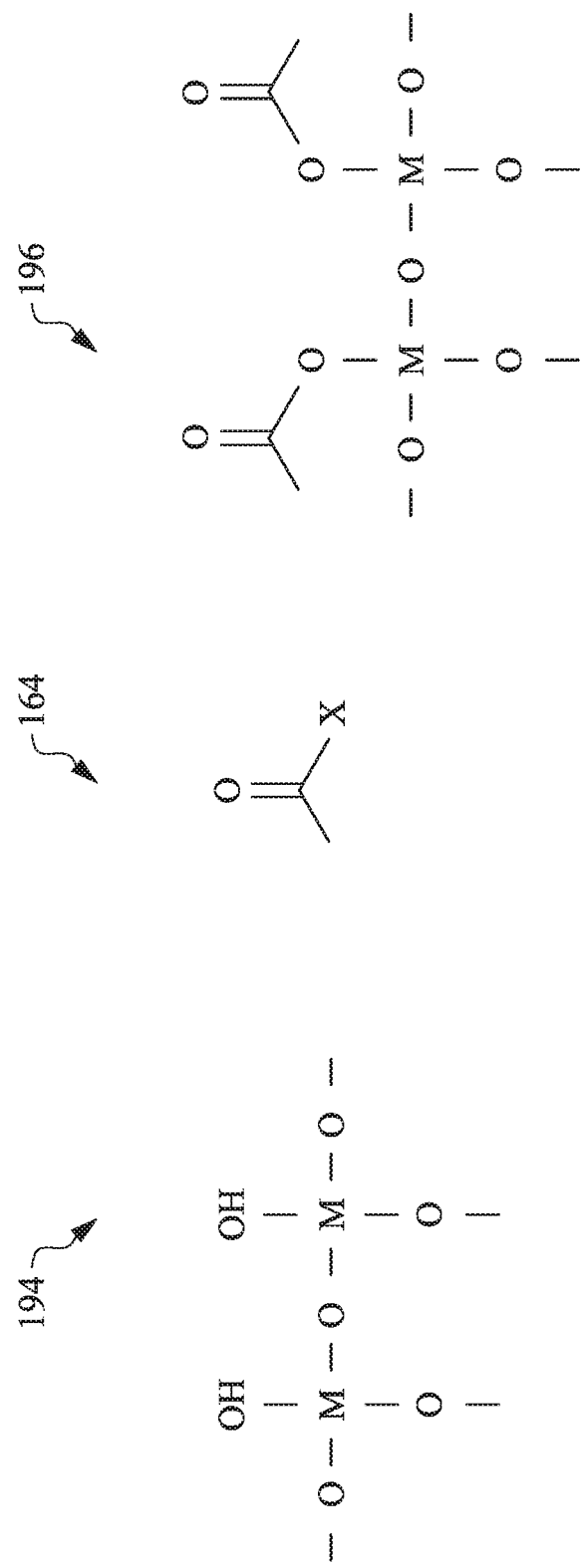
FIGS. 19, 20 and 21 are diagrammatical views of reactions between the BARC layer and the MePR layer, constructed according to aspects of the present disclosure in some embodiments.

The interface layer 118 and the corresponding reaction forming the same are further describe below with various examples. As described above, the reactive chemical groups 134 include capping monomers, chelating ligands, or both. One example is illustrated in FIG. 19. In this example, the MePR layer 116 includes a metal structure 194 having metal oxide bonded with OH groups while the reactive chemical group 134 of the BARC layer 114 includes a capping monomer 164 (as one illustrated in FIG. 13) having oxygen "O" and a halogen "X" bonded together. During the second baking process 119, the capping monomer 164 reacts with the metal structure 194, forming a different metal-containing chemical structure 196. In this reaction, the capping monomer 164 reacts with M—OH bonds of the MePR layer 116. Specifically, the M—OH bond of the MePR layer 116 and the C—X bond of the capping monomer 164 are condensed to C—O—M bond.

Figure 20:
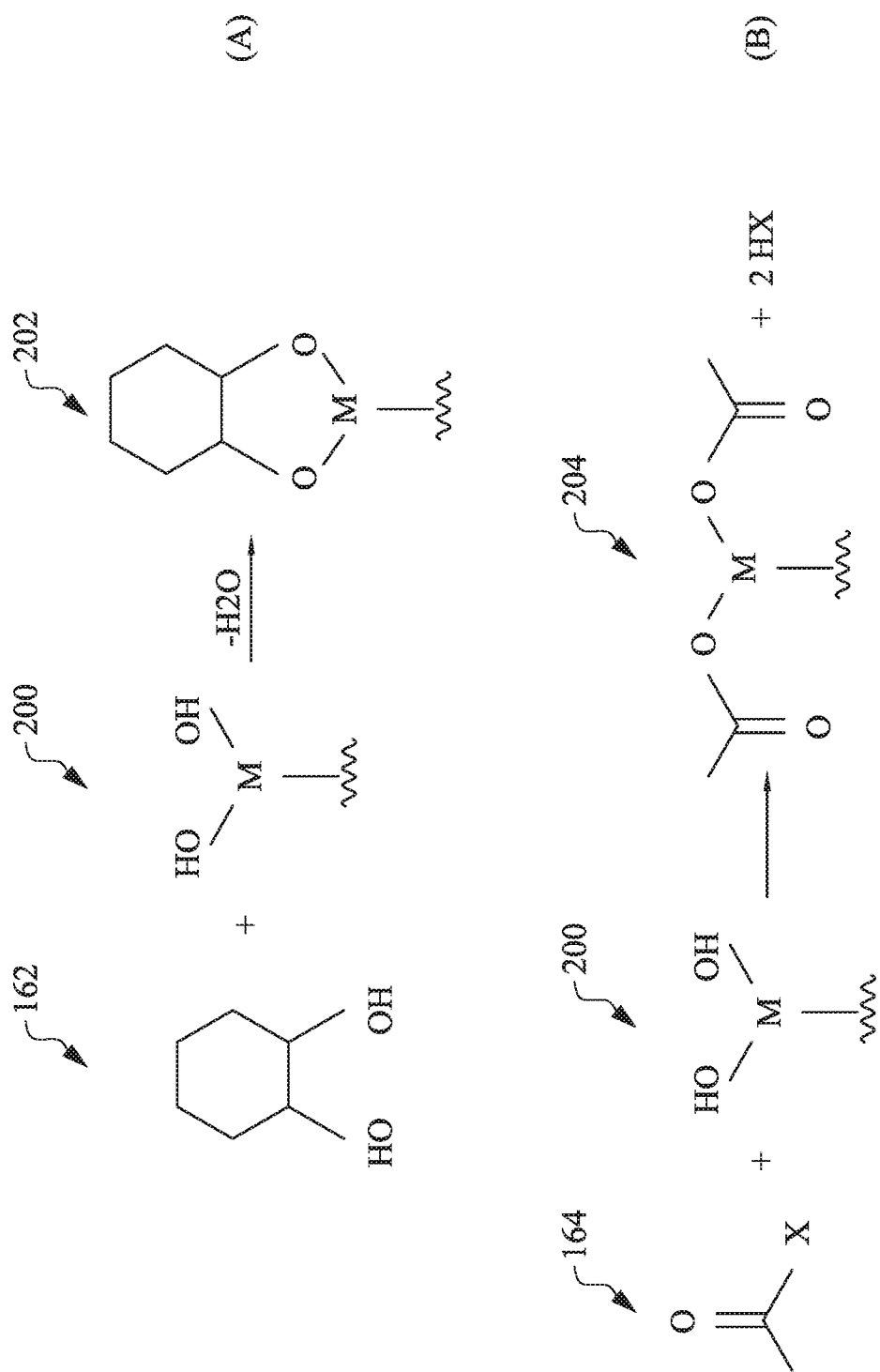

Another example is illustrated in FIG. 20 (A). In this example, the MePR layer 116 includes a metal structure 200 having metal bonded with OH groups while the reactive chemical group 134 of the BARC layer 114 includes a capping monomer 162 (as one illustrated in FIG. 13) having a cyclohexyl ring bonded with OH groups. During the second baking process 119, the capping monomer 162 reacts with the metal structure 200, forming a metal-containing chemical structure 202 through a dehydration reaction.

Another example is illustrated in FIG. 20 (B). In this example, the MePR layer 116 includes the metal structure 200 while the reactive chemical group 134 of the BARC layer 114 includes the capping monomer 164. During the second baking process 119, the capping monomer 164 reacts with the metal structure 200, forming a metal-containing chemical structure 204 through a condensation reaction.

Figure 12:
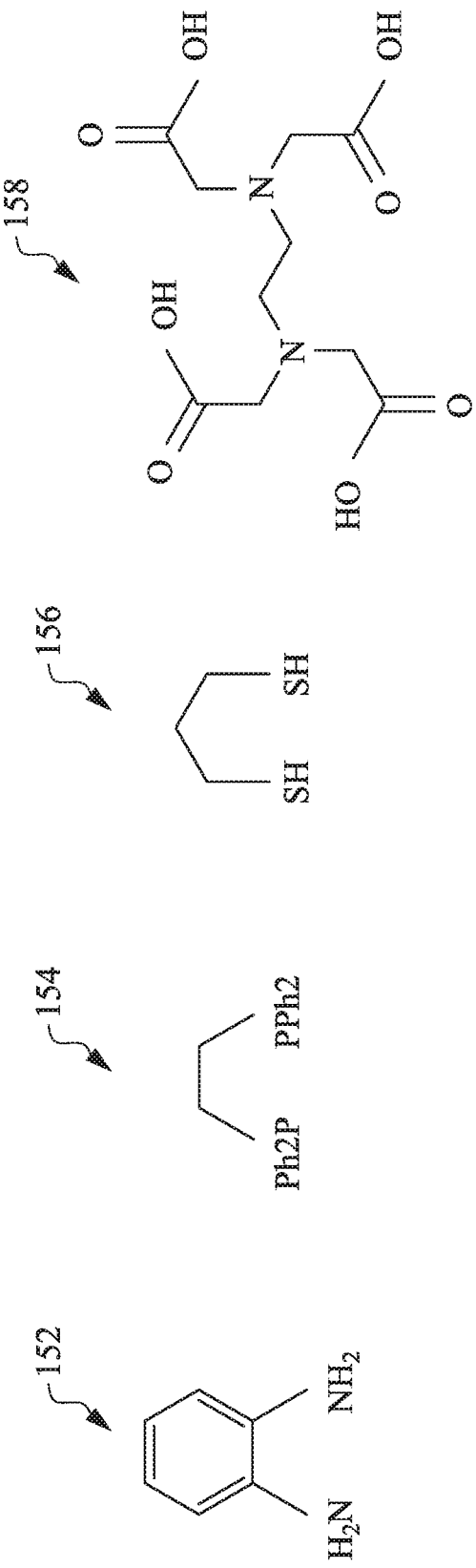
Figure 21:
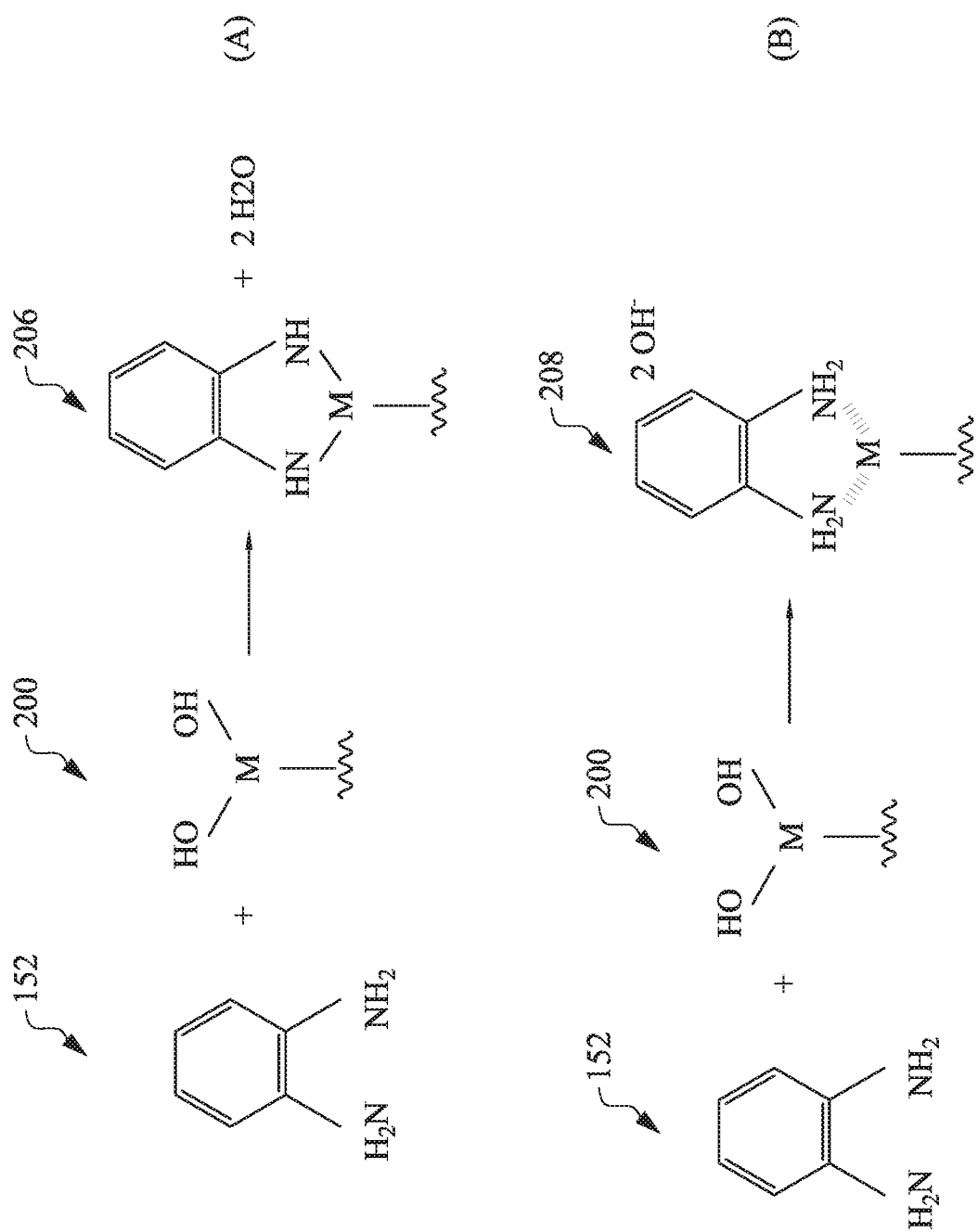

FIG. 21 provides two examples of the reaction of the MePR layer 116 and the BARC layer 114, in which the reactive chemical group 134 includes chelating ligands. One example is illustrated in FIG. 21 (A). In this example, the MePR layer 116 includes the metal structure 200 while the reactive chemical group 134 of the BARC layer 114 includes the chelating ligand 152 (as illustrated in FIG. 12). During the second baking process 119, the chelating ligand 152 reacts with the metal structure 200, forming a metal-containing chemical structure 206 through a dehydration reaction.

Another example is illustrated in FIG. 21 (B). In this example, the MePR layer 116 includes the metal structure 200 while the reactive chemical group 134 of the BARC layer 114 includes the chelating ligand 152. During the second baking process 119, the chelating ligand 152 reacts with the metal structure 200, forming a metal-containing chemical structure 208 through a coordination reaction.

Generally, the interaction between the metal of the MePR layer 116 and the reactive chemical group 134 of the BARC layer 114 includes ionic bond, covalent bond, hydrogen bond or a combination thereof.

Referring back to FIG. 5, the reaction between the metal of the MePR layer 116 and the reactive chemical group 134 of the BARC layer 114 forms the interface layer 118. The interface layer 118 includes metal 120 from the MePR layer 116. Particularly, the metal 120 is chemically bonded to both the overlying MePR layer 116 and the underlying BARC layer 114, therefore increasing the adhesion strength. Furthermore, since the metal is bonded to the MePR layer 116 and the reactive chemical group 134 is bonded to the organic polymer 132, both are not able to diffuse. When the bonding is formed between the metal of the MePR layer 116 and the reactive chemical group 134 of the BARC layer 114, it is distributed in a very thin layer. In some examples, the thickness of the interface layer 118 ranges between 0.5 nm and 2 nm.

Figure 22:
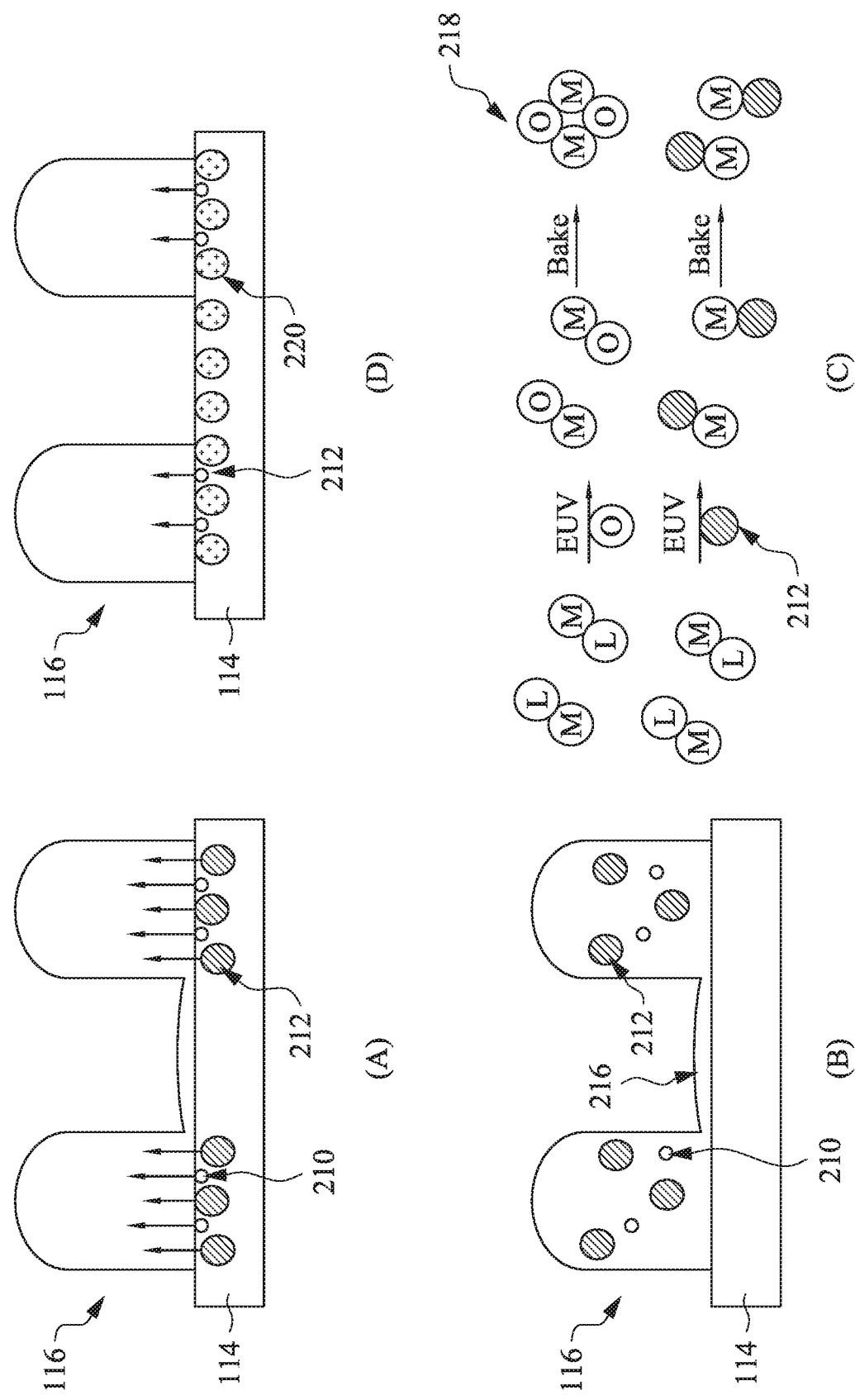
FIG. 22 is a diagrammatical view of photoacid generators (PAGs) of the BARC layer and corresponding reaction with photoresist, constructed according to aspects of the present disclosure in some embodiments.

In some embodiments, the BARC layer 114 includes fluoro-containing PAGs 172 additionally or alternatively bonded to the organic polymer 132. As described above, the PAGs in the BARC layer 114 can enhance the lithography process, such as the acid generated from the PAGs upon EUV radiation can diffuse into the MePR layer 116, enhance the exposure effect and reduce the footing issue. Furthermore, the bonded fluoro-containing PAGs 172 can further enhance the bonding between the metal of the MePR layer 116 and the reactive chemical group 134 of the BARC layer 114, therefore enhancing the adhesion. This is illustrated in FIG. 22.

When the PAGs are not bonded, PAGs dissociate to PAG cations ($H^{3O}$) 210 and PAG anions 212 upon EUV radiation, as illustrated in FIG. 22(A). The PAG anions 212 diffused into the MePR layer 116 inhibit the formation of M-O bonding (such as Sn-O bonding), causing photoresist pattern collapsing and degraded line-width roughness (LWR), as illustrated in FIG. 22(B). The inhibition mechanism is schematically illustrated in FIG. 22(C). For example, the chelating ligands (labeled as "L") of the BARC layer 114 and the metal of the MePR layer 116 bond together after the second baking process 119. Upon EUV radiation during the lithography exposure process, the metal and oxygen (labeled as "0") forms M-O bonds and further crosslinked to form metal-containing inorganic polymers 218 during a baking process, such as post-exposure baking (PEB). The metal-containing inorganic polymers 218 in the exposed portions are insoluble in the developer while the unexposed portions are dissolved in the developer and removed, properly functioning as negative-tone photoresist. However, when the unbonded PAG anions 212 diffuse into the MePR layer 116, the metal is bonded to the PAG anions 212. That inhibits the formation of M-O bonding during the baking process.

When the PAGs are bonded to the organic polymer 132 of the BARC layer 114, PAGs dissociate to PAG cations ($H^+$) 210 and bonded PAG anions 220 upon EUV radiation, as illustrated in FIG. 22(D). The bonded PAG anions 220 cannot diffuse deep into the MePR layer 116 and modifies the surface of the MePR layer 116, improving photoresist pattern quality with reduced collapsing, scum and LWR issues.

Now referring to FIG. 1 in conjunction with FIG. 6, the method 50 proceeds to an operation 62 by performing an exposure process 122 to the MePR layer 116 utilizing an EUV radiation from an EUV lithography system, thereby forming a latent pattern of the MePR layer 116 including unexposed portions 116a and exposed portions 116b. Since the interface layer 118 also includes the metal 120 and is sensitive to the EUV radiation, the latent pattern may be extended to the interface layer 118 as well. In the present embodiment, the EUV radiation has a wavelength of 13.5 nm. The operation 62 is performed in a vacuum. In some embodiments, the radiation beam is directed to the MePR layer 116 to form an image of a circuit pattern defined on a photomask (such as a reflective mask) in a proper exposure mode such as step-and-scan. Various resolution enhancement techniques, such as phase-shifting, off-axis illumination (OAI) and/or optical proximity correction (OPC), may be used or implemented through the photomask or the exposure process. For examples, the OPC features may be incorporated into the circuit pattern on the photomask. In another example, the photomask is a phase-shift mask, such as an alternative phase-shift mask, an attenuated phase-shift mask, or a chrome-less phase-shift mask. In yet another example, the exposure process is implemented in an off-axis illumination mode. In some other embodiments, the radiation beam is directly modulated with a predefined pattern (such as an IC layout) without using a photomask (such as using a digital pattern generator or direct-write mode).

Referring now to FIG. 1, the method 50 may proceed to an operation 64 by performing a post-exposure baking (PEB) process to the semiconductor structure 100, especially to the MePR layer 116. In a specific embodiment, the PEB process may be performed in a thermal chamber at temperature ranging between about 120° C. to about 200° C. This formation of the interface layer 118 and the corresponding reaction may additionally be continued and enhanced during the PEB process or alternatively initiated at the PEB process before the MePR layer 116 is patterned by the developing process.

Referring now to FIG. 1 in conjunction with FIG. 7, the method 50 may proceed to an operation 66 by developing the MePR layer 116 in a developer. By the developing process, a patterned photoresist (PR) layer 116' is formed. In the present embodiment, the MePR layer 116 is a negative-tone photoresist and the exposed portions 116b of the MePR layer 116 experience crosslinking and polymerization, therefore remain after the developing process. The patterned PR layer 116' includes various openings 124, defining a pattern to be transferred to the under layer 112. The developer may include an aqueous solvent, such as tetramethyl ammonium hydroxide (TMAH), or alternatively an organic solvent, such as butyl acetate.

Referring to FIGS. 1 and 8, the method 50 includes an operation 68 by performing a fabrication process 126 to the semiconductor structure 100 using the patterned resist layer 116' as a mask such that the fabrication process is only applied to the portions of the semiconductor structure 100 within the openings 124 of the patterned resist layer 116' while other portions covered by the patterned resist layer 116' are protected from being impacted by the fabrication process. In some embodiments, the fabrication process includes an etching process applied to the under layer 112 using the patterned resist layer 116' as an etch mask, thereby transferring the pattern from the patterned resist layer 116' to the under layer 112. In alternative embodiments, the fabrication process includes an ion implantation process applied to the semiconductor structure 100 using the patterned resist layer 116' as an implantation mask, thereby forming various doped features in the semiconductor structure 100.

In the present example, the under layer 112 is a hard mask. To further this embodiment, the pattern is first transferred from the patterned resist layer 116' to the hard mask layer 112, then to other layers of the substrate 110. For example, the hard mask 112 may be etched through openings of the patterned resist layer 116' using a dry (plasma) etching, a wet etching, and/or other etching methods. The dry etching process may implement an oxygen-containing gas, a fluorine-containing gas, a chlorine-containing gas, a bromine-containing gas, an iodine-containing gas, other suitable gases and/or plasmas, and/or combinations thereof. The patterned resist layer 116' may be partially consumed during the etching of the hard mask 112. In an embodiment, the remaining portion of the patterned resist layer 116' may be stripped off, leaving the patterned hard mask 112 over the substrate 110.

Although not shown in FIG. 1, the method 50 may include other operations before, during or after the operations described above. In an embodiment, the substrate 110 is a semiconductor substrate and the method 50 proceeds to forming devices, such as fin field effect transistor (FinFET) structures or GAA transistors. In this embodiment, the method 50 includes forming a plurality of active fins in the substrate 110. In furtherance of the embodiment, the operation 68 further includes etching the substrate 110 through the openings of the patterned hard mask 112 to form trenches in the substrate 110; filling the trenches with a dielectric material; performing a chemical mechanical polishing (CMP) process to form shallow trench isolation (STI) features; and epitaxy growing or recessing the STI features to form fin-like active regions. In another embodiment, the method 50 includes other operations to form a plurality of gate electrodes on the substrate 110. The method 50 may further form gate spacers, doped source/drain regions, contacts for gate/source/drain features, etc. In another embodiment, a target pattern is to be formed as metal lines in a multilayer interconnection structure. For example, the metal lines may be formed in an inter-layer dielectric (ILD) layer of the substrate 110, which has been etched by operation 68 to form a plurality of trenches. The method 50 proceeds to filling the trenches with a conductive material, such as a metal; and further proceeds to polishing the conductive material using a process such as CMP to expose the patterned ILD layer, thereby forming the metal lines in the ILD layer. The above are non-limiting examples of devices/structures that can be made and/or improved using the method 50 and the MePR layer 116 according to various aspects of the present disclosure.

The present disclosure provides the MePR layer 116 and the underlying BARC layer 114, and the method 50 to employ various characteristic of those materials, implement EUV lithography process, interact the BARC layer 114 with the MePR layer 116 to form the interface layer 118 to increase the adhesion strength and reduce photoresist scum. Particularly, the BARC layer 114 includes the reactive chemical group 134 (such as chelating ligands or capping monomers) and the fluoro-containing PAGs bonded to the organic polymer 132 of the BARC layer 114. With the disclosed method 50, the MePR layer 116, the underlying BARC layer 114 and the interface layer 118 therebetween, photoresist collapsing, peeling and scum issues are reduced or eliminated.

In one example aspect, the present disclosure provides a lithography method of semiconductor fabrication. The method includes forming a bottom anti-reflective coating (BARC) layer on a substrate, wherein the BARC layer includes an organic polymer and a reactive chemical group having at least one of chelating ligands and capping monomers, wherein the reactive chemical group is bonded to the organic polymer; coating a metal-containing photoresist (MePR) layer on the BARC layer, wherein the MePR being sensitive to an extreme ultraviolet (EUV) radiation; performing a first baking process to the MePR layer and the BARC layer, thereby reacting a metal chemical structure of the MePR layer and the reactive chemical structure of the BARC layer and forming an interface layer between the MePR layer and the BARC layer; performing an exposure process using the EUV radiation to the MePR layer; and developing the MePR layer to form a patterned photoresist layer.

In another example aspect, the present disclosure provides a lithography method of semiconductor fabrication. The method includes forming an under layer on a semiconductor substrate; forming a bottom anti-reflective coating (BARC) layer on the under layer, wherein the BARC layer includes an organic polymer, fluoro-containing photoacid generator (PAG), and a reactive chemical group having at least one of chelating ligands and capping monomers, wherein the reactive chemical group and fluoro-containing PAG are bonded to the organic polymer; coating a metal-containing photoresist (MePR) layer on the BARC layer, wherein the MePR being sensitive to an extreme ultraviolet (EUV) radiation; performing a baking process to the MePR layer and the BARC layer, thereby reacting a metal of the MePR layer and the reactive chemical structure of the BARC layer to form an interface layer between the MePR layer and the BARC layer, wherein the interface layer includes a chemical bond between the metal and the reactive chemical group; performing an exposure process using the EUV radiation to the MePR layer; and developing the MePR layer to form a patterned photoresist layer.

In yet another example aspect, the present disclosure provides a lithography method of semiconductor fabrication. The method includes forming a bottom anti-reflective coating (BARC) layer on the semiconductor substrate, wherein the BARC layer includes an organic polymer, fluoro-containing photoacid generator (PAG), and a reactive chemical group having at least one of chelating ligands and capping monomers, wherein the reactive chemical group and fluoro-containing PAG are bonded to the organic polymer; coating a metal-containing photoresist (MePR) layer on the BARC layer, wherein the MePR being sensitive to an extreme ultraviolet (EUV) radiation; performing a baking process to the MePR layer and the BARC layer, thereby reacting a metal of the MePR layer and the reactive chemical structure of the BARC layer to form a chemical bond between the metal and the reactive chemical group; performing an exposure process using the EUV radiation to the MePR layer; and developing the MePR layer to form a patterned photoresist layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a bottom anti-reflective coating (BARC) layer on a substrate, wherein the BARC layer includes an organic polymer and a reactive chemical group having at least one of chelating ligands and capping monomers, wherein the reactive chemical group is bonded to the organic polymer;
   coating a metal-containing photoresist (MePR) layer on the BARC layer, wherein the MePR being sensitive to an extreme ultraviolet (EUV) radiation;
   performing a first baking process to the MePR layer and the BARC layer, thereby reacting a metal chemical structure of the MePR layer and the reactive chemical group of the BARC layer and forming an interface layer between the MePR layer and the BARC layer;
   performing an exposure process using the EUV radiation to the MePR layer; and
   developing the MePR layer to form a patterned photoresist layer.

2. The method of claim 1, further comprising performing a first etching process to transfer a pattern of the patterned photoresist layer to an under layer on the substrate.

3. The method of claim 1, wherein the organic polymer includes at least one of Polystyrene (PS), Poly-hydroxystyrene (PHS) resin polymer, Poly(methyl methacrylate) (PMMA), and poly(methyl acrylate) (PMA).

4. The method of claim 3, wherein the reactive chemical group includes at least one of Monodentate, Bidentate, Tridentate, Hexadentate and a combination thereof.

5. The method of claim 1, wherein the BARC layer further includes photoacid generators (PAGs) bonded to the organic polymer of the BARC layer.

6. The method of claim 5, wherein
   the PAGs include triphenylsulfonium triflate; and
   the reactive chemical group includes

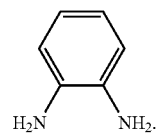

7. The method of claim 1, wherein the interface layer is chemically boned to the MePR layer and the organic polymer of the BARC layer.

8. The method of claim 7, wherein the interface layer includes a metal selected from the group consisting of tin (Sn), cobalt (Co), nickel (Ni), iron (Fe), ruthenium (Ru), and rhodium (Rh).

9. The method of claim 7, wherein the interface layer has a thickness ranging between 0.5 nm and 2 nm.

10. The method of claim 1, further comprising performing a second baking process to the BARC layer prior to the coating of the MePR layer, wherein the second baking process has a baking temperature greater than that of the first baking process.

11. The method of claim 1, wherein the first baking process causes the BARC layer and the MePR layer to have a dehydration reaction between the metal chemical structure and the reactive chemical group.

12. The method of claim 1, wherein the first baking process causes the BARC layer and the MePR layer to have a condensation reaction between the metal chemical structure and the reactive chemical group.

13. A method, comprising:
forming an under layer on a semiconductor substrate;
forming a bottom anti-reflective coating (BARC) layer on the under layer, wherein the BARC layer includes an organic polymer, fluoro-containing photoacid generator (PAG), and a reactive chemical group having at least one of chelating ligands and capping monomers, wherein the reactive chemical group and fluoro-containing PAG are bonded to the organic polymer;
coating a metal-containing photoresist (MePR) layer on the BARC layer, wherein the MePR being sensitive to an extreme ultraviolet (EUV) radiation;
performing a baking process to the MePR layer and the BARC layer, thereby reacting a metal of the MePR layer and the reactive chemical group of the BARC layer to form an interface layer between the MePR layer and the BARC layer, wherein the interface layer includes a chemical bond between the metal and the reactive chemical group;
performing an exposure process using the EUV radiation to the MePR layer; and
developing the MePR layer to form a patterned photoresist layer.

14. The method of claim 13, further comprising performing a first etching process to transfer a pattern of the patterned photoresist layer to the under layer on the substrate.

15. The method of claim 13, wherein
the organic polymer includes at least one of Polystyrene (PS), Poly-hydroxy-styrene (PHS) resin polymer, Poly (methyl methacrylate) (PMMA), and poly (methyl acrylate) (PMA);
the reactive chemical group includes at least one of Monodentate, Bidentate, Tridentate, Hexadentate and a combination thereof; and
the PAGs include triphenylsulfonium triflate.

16. The method of claim 15, wherein the interface layer includes a metal selected from the group consisting of tin (Sn), cobalt (Co), nickel (Ni), iron (Fe), ruthenium (Ru), and rhodium (Rh).

17. The method of claim 13, wherein the interface layer has a thickness ranging between 0.5 nm and 2 nm.

18. The method of claim 13, wherein the baking process to the MePR layer and the BARC layer is a first baking process, the method further comprising performing a second baking process to the BARC layer before the coating of the MePR layer, wherein the second baking process has a baking temperature greater than that of the first baking process.

19. A method, comprising:
forming a bottom anti-reflective coating (BARC) layer on the semiconductor substrate, wherein the BARC layer includes an organic polymer, fluoro-containing photoacid generator (PAG), and a reactive chemical group having at least one of chelating ligands and capping monomers, wherein the reactive chemical group and fluoro-containing PAG are bonded to the organic polymer;
coating a metal-containing photoresist (MePR) layer on the BARC layer, wherein the MePR being sensitive to an extreme ultraviolet (EUV) radiation;
performing a baking process to the MePR layer and the BARC layer, thereby reacting a metal of the MePR layer and the reactive chemical group of the BARC layer to form a chemical bond between the metal and the reactive chemical group;
performing an exposure process using the EUV radiation to the MePR layer; and
developing the MePR layer to form a patterned photoresist layer.

20. The method of claim 19, wherein
the organic polymer includes at least one of Polystyrene (PS), Poly-hydroxy-styrene (PHS) resin polymer, Poly (methyl methacrylate) (PMMA), and poly (methyl acrylate) (PMA);
the reactive chemical group includes at least one of Monodentate, Bidentate, Tridentate, Hexadentate and a combination thereof;
the PAGs include triphenylsulfonium triflate; and
the MePR layer includes

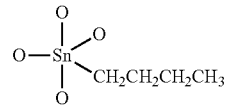

* * * * *